(12) United States Patent
Fang et al.

(10) Patent No.: US 10,529,749 B2
(45) Date of Patent: Jan. 7, 2020

(54) MANUFACTURING METHOD FOR THIN FILM TRANSISTOR ARRAY SUBSTRATE

(71) Applicant: Shenzhen China Star Optoelectronics Semiconductor Display Technology Co., Ltd., Shenzhen, Guangdong (CN)

(72) Inventors: Chunhsiung Fang, Guangdong (CN); Poyen Lu, Guangdong (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 29 days.

(21) Appl. No.: 15/580,177

(22) PCT Filed: Nov. 9, 2017

(86) PCT No.: PCT/CN2017/110200
§ 371 (c)(1),
(2) Date: Dec. 6, 2017

(87) PCT Pub. No.: WO2019/061711
PCT Pub. Date: Apr. 4, 2019

(65) Prior Publication Data
US 2019/0103423 A1      Apr. 4, 2019

(30) Foreign Application Priority Data
Sep. 30, 2017    (CN) ............................ 2017 1 0916437

(51) Int. Cl.
*H01L 27/12*    (2006.01)
*H01L 21/02*    (2006.01)
*H01L 21/027*   (2006.01)
*H01L 29/786*   (2006.01)
*H01L 29/45*    (2006.01)
(Continued)

(52) U.S. Cl.
CPC ...... *H01L 27/1288* (2013.01); *H01L 21/0274* (2013.01); *H01L 21/02565* (2013.01); *H01L 21/02614* (2013.01); *H01L 27/127* (2013.01); *H01L 27/1225* (2013.01); *H01L 27/1259* (2013.01); *H01L 29/45* (2013.01); *H01L 29/66969* (2013.01); *H01L 29/7869* (2013.01); *H01L 29/78609* (2013.01); *H01L 29/78618* (2013.01); *G02F 1/1368* (2013.01)

(58) Field of Classification Search
CPC .................. H01L 21/02565; H01L 27/1288
See application file for complete search history.

(56) References Cited

U.S. PATENT DOCUMENTS

| 2010/0006851 A1* | 1/2010 | Park | H01L 29/41733 257/72 |
| 2016/0372606 A1* | 12/2016 | Ito | H01L 29/78693 |
| 2017/0125604 A1* | 5/2017 | Oshima | G02F 1/1368 |

* cited by examiner

*Primary Examiner* — Seahvosh Nikmanesh
(74) *Attorney, Agent, or Firm* — Muncy, Geissler, Olds & Lowe, P.C.

(57) ABSTRACT

A manufacturing method for a thin film transistor array substrate is provided. The method includes steps of depositing a first photoresist layer on a substrate before depositing the active metal layer; removing the first photoresist layer on a surface of the gate layer from the active metal by a removing process after exposing and developing the first photoresist layer, so that a surface of the gate layer is not covered by the active metal; chemically reacting the active metal with a portion of the active layer by a predetermined process.

18 Claims, 6 Drawing Sheets

(51) Int. Cl.
*H01L 29/66* (2006.01)
*G02F 1/1368* (2006.01)

MANUFACTURING METHOD FOR THIN FILM TRANSISTOR ARRAY SUBSTRATE

FIELD OF INVENTION

The present disclosure relates to the field of manufacturing display panels, and more particularly to a manufacturing method for a thin film transistor array substrate.

BACKGROUND OF DISCLOSURE

Liquid crystal displays (LCD) are widely used flat panel displays. Image display is achieved mainly by an LCD switch modulating light field intensity of a backlight resource. The LCD display includes a thin film transistor (TFT) device. In a thin film transistor liquid crystal display (TFT-LCD), each liquid crystal pixel on such a display device is driven by a thin film transistor integrated therebehind. Therefore, the TFT-LCD has a high response speed, high brightness, high contrast, small size, low power consumption, no radiation, etc., and is dominant in the current display market.

A film structural diagram of a thin film transistor array substrate in a prior art is as shown in FIG. 1. The array substrate includes a substrate 101, a buffer layer 102, an active layer 103, a gate insulation layer 104, a gate layer 105, an active metal layer 106, an interlayer insulation layer 107, a source/drain layer 108, and a passivation layer 109.

In the prior art, by depositing an active metal layer 106 on the gate layer 105 and reacting the active metal 106 with a portion of the active layer by a high temperature annealing process, the active metal layer 106 reacts with oxygen in the active layer 103 to form a corresponding metal oxide, and the active layer generates oxygen vacancies due to oxygen elements being lost, thereby reducing resistance of the active layer 103, so that the portion of the active layer where the reaction occurs is converted from a semiconductor into a conductor. A via hole is formed in the interlayer insulation layer in the array substrate, such that the source/drain region 108 is electrically connected to the portion of the active layer through the via hole in the interlayer insulation layer. Sometimes, due to errors of the annealing process or the relatively thick active metal film, the remaining active metal does not completely react to form a metal oxide, so that the gate 105, the gate insulation layer 104, and the active layer are electrically connected to form a leakage path between the gate 105 and the active layer 106, due to the active metal film.

SUMMARY OF THE INVENTION

The present disclosure provides a manufacturing method for a thin film transistor array substrate, which solves the problem that in the prior art, due to errors of the annealing process or the relatively thick active metal film, the remaining active metal does not completely react to form a metal oxide, so that due to the active metal film, the gate, the gate insulation layer, and the active layer are electrically connected to form a leakage path between the gate and the active layer.

In order to solve the above problem, the technical solution provided by the present disclosure is as follows:

A manufacturing method for a thin film transistor array substrate is provided in the present disclosure, and includes steps of:

step S30: depositing a first metal layer on a gate insulation layer, and performing a first photomask process on the first metal layer, using a first mask, to form a gate and a gate line of the thin film transistor on a surface of the gate insulation layer;

step S40: depositing a first photoresist layer on a substrate, and exposing the first photoresist layer, using a mask, to pattern the first photoresist layer and form a first photoresist region;

step S50: depositing a second metal layer on the substrate, wherein the second metal layer is an active metal, the active metal is one or more mixtures of magnesium, aluminum, and calcium, and a film thickness of the second metal layer ranges from 5 nm to 50 nm;

step S60: removing the first photoresist from the first photoresist region, and reacting the second metal layer with a portion of an active layer by a predetermined process, so that the active layer forms a first active layer region and a second active layer region;

step S70: depositing an interlayer insulation layer on the substrate, and forming a via hole on the interlayer insulation layer by an etching process to expose the first active layer region; and step S80: depositing a third metal layer on the interlayer insulation layer, performing a second photomask process on the third metal layer, using a second mask, to form a source and a drain of the thin film transistor on a surface of the interlayer insulation layer, and depositing a passivation layer.

In accordance with a preferred embodiment of the present disclosure, before the step S30, the manufacturing further includes:

step S10: providing the substrate, sequentially depositing a buffer layer and the active layer on the substrate, and patterning the active layer, using a third mask process; and step S20: depositing a gate insulation layer on the active layer, wherein the gate insulation layer covers the active layer and the buffer layer.

In accordance with a preferred embodiment of the present disclosure, the step S30 includes steps of:

step S31: depositing the first metal layer on the gate insulation layer;

step S32: coating a second photoresist layer on the first metal layer;

step S33: after the second photoresist layer is exposed and developed, performing a first etching process on the first metal layer, to form the gate and the gate line of the thin film transistor on the surface of the gate insulation layer; and step S34: performing a second etching process on the gate insulation layer to expose both ends of the active layer, so that the second metal layer is in contact with the both ends of the active layer;

step S35: removing the second photoresist layer.

In accordance with a preferred embodiment of the present disclosure, an area of the active layer is greater than an area of the gate insulation layer, and an area of the gate insulation layer is greater than an area of the first metal layer.

In accordance with a preferred embodiment of the present disclosure, the step S60 includes steps of:

step S61: removing the first photoresist and a portion of the second metal layer deposited on the first photoresist region from the first photoresist region; and step S62: reacting an unremoved portion of the second metal layer with the portion of the active layer by the predetermined process, so that the active layer forms a first active layer region and a second active layer region.

In accordance with a preferred embodiment of the present disclosure, the predetermined process is a high temperature annealing process performed in an aerobic or anaerobic environment, wherein a temperature corresponding to the high temperature annealing process ranges from 200° C. to 400° C.

In accordance with a preferred embodiment of the present disclosure, the unremoved portion of the active metal reacts with the portion of the active layer by the high temperature annealing process, wherein the active metal reacts with an oxygen element in the active layer to form a corresponding metal oxide, the active layer is transformed into a conductor by losing the oxygen element to form the first active layer region, and the second active layer region is an unreacted region.

In accordance with a preferred embodiment of the present disclosure, the step S80 includes steps of:

step S81: depositing the third metal layer on the interlayer insulation layer;

step S82: coating a third photoresist layer on the third metal layer;

step S83: after the third photoresist layer is exposed and developed, an etching process is performed on the third metal layer to form a source and a drain of the thin film transistor on the surface of the interlayer insulation layer;

step 84: removing the third photoresist layer; and step 85: depositing the passivation layer.

In accordance with a preferred embodiment of the present disclosure, the source and the drain are electrically connected to the first active layer region through the via hole on the interlayer insulation layer.

A manufacturing method for a thin film transistor array substrate is provided in the present disclosure, and includes steps of:

step S30: depositing a first metal layer on a gate insulation layer, and performing a first photomask process on the first metal layer, using a first mask, to form a gate and a gate line of the thin film transistor on a surface of the gate insulation layer;

step S40: depositing a first photoresist layer on a substrate, and exposing the first photoresist layer, using a mask, to pattern the first photoresist layer and form a first photoresist region;

step S50: depositing a second metal layer on the substrate;

step S60: removing the first photoresist from the first photoresist region, and reacting the second metal layer with a portion of an active layer by a predetermined process, so that the active layer forms a first active layer region and a second active layer region;

step S70: depositing an interlayer insulation layer on the substrate, and forming a via hole on the interlayer insulation layer by an etching process to expose the first active layer region; and step S80: depositing a third metal layer on the interlayer insulation layer, performing a second photomask process on the third metal layer, using a second mask, to form a source and a drain of the thin film transistor on a surface of the interlayer insulation layer, and depositing a passivation layer.

In accordance with a preferred embodiment of the present disclosure, before the step S30, the manufacturing further includes:

step S10: providing the substrate, sequentially depositing a buffer layer and the active layer on the substrate, and patterning the active layer, using a third mask process; and step S20: depositing a gate insulation layer on the active layer, wherein the gate insulation layer covers the active layer and the buffer layer.

In accordance with a preferred embodiment of the present disclosure, the step S30 includes steps of:

step S31: depositing the first metal layer on the gate insulation layer;

step S32: coating a second photoresist layer on the first metal layer;

step S33: after the second photoresist layer is exposed and developed, performing a first etching process on the first metal layer, to form the gate and the gate line of the thin film transistor on the surface of the gate insulation layer; and step S34: performing a second etching process on the gate insulation layer to expose both ends of the active layer, so that the second metal layer is in contact with the both ends of the active layer;

step S35: removing the second photoresist layer.

In accordance with a preferred embodiment of the present disclosure, an area of the active layer is greater than an area of the gate insulation layer, and an area of the gate insulation layer is greater than an area of the first metal layer.

In accordance with a preferred embodiment of the present disclosure, the step S60 includes steps of:

step S61: removing the first photoresist and a portion of the second metal layer deposited on the first photoresist region from the first photoresist region; and step S62: reacting an unremoved portion of the second metal layer, not being removed, with the portion of the active layer by the predetermined process, so that the active layer forms a first active layer region and a second active layer region.

In accordance with a preferred embodiment of the present disclosure, the predetermined process is a high temperature annealing process performed in an aerobic or anaerobic environment, wherein a temperature corresponding to the high temperature annealing process ranges from 200° C. to 400° C.

In accordance with a preferred embodiment of the present disclosure, the unremoved portion of the active metal reacts with the portion of the active layer by the high temperature annealing process, wherein the active metal reacts with an oxygen element in the active layer to form a corresponding metal oxide, the active layer is transformed into a conductor by losing the oxygen element to form the first active layer region, and the second active layer region is an unreacted region.

In accordance with a preferred embodiment of the present disclosure, the step S80 includes steps of:

step S81: depositing the third metal layer on the interlayer insulation layer;

step S82: coating a third photoresist layer on the third metal layer;

step S83: after the third photoresist layer is exposed and developed, an etching process is performed on the third metal layer to form a source and a drain of the thin film transistor on the surface of the interlayer insulation layer;

step 84: removing the third photoresist layer; and step 85: depositing the passivation layer.

In accordance with a preferred embodiment of the present disclosure, the source and the drain are electrically connected to the first active layer region through the via hole on the interlayer insulation layer.

The present disclosure has the following advantages: compared with the prior art, the method in the present disclosure includes steps of depositing the first photoresist layer on the substrate before depositing the active metal layer; removing the first photoresist layer on the surface of the first metal layer from the active metal by a removing process after exposing and developing the first photoresist layer, thereby avoiding the problem of electrical leakage of the TFT array substrate due to incomplete oxidation of the active metal. Moreover, the gate insulation layer and the first metal layer are etched in the same photomask process, thereby reducing costs and improving manufacturing efficiency.

BRIEF DESCRIPTION OF DRAWINGS

In order to more clearly illustrate the embodiments of the present disclosure or the technical solutions in prior arts, the following briefly introduces the accompanying drawings used in the embodiments. Obviously, the drawings in the following description merely show some of the embodiments of the present disclosure. As regards one of ordinary skill in the art, other drawings can be obtained in accordance with these accompanying drawings without making creative efforts.

DETAILED DESCRIPTION OF PREFERRED EMBODIMENTS

The following description of the embodiments with reference to the accompanying drawings is used to illustrate particular embodiments of the present disclosure. The directional terms referred in the present disclosure, such as "upper", "lower", "front", "back", "left", "right", "inner", "outer", "side surface", etc., are only directions with regard to the accompanying drawings. Therefore, the directional terms used for describing and illustrating the present disclosure are not intended to limit the present disclosure.

The present disclosure aims at the following technical problem in a conventional thin film transistor array substrate: When an active metal film is deposited on a gate layer, the active metal film connects the gate layer, a gate insulation layer, and an active layer. Under the condition of errors of the annealing process or the relatively thick active metal film, the remaining active metal does not completely react to form a metal oxide, so that a gate, a gate insulation layer, and an active layer are electrically connected to form a leakage path between the gate and the active layer, due to the active metal film.

Figure 1:
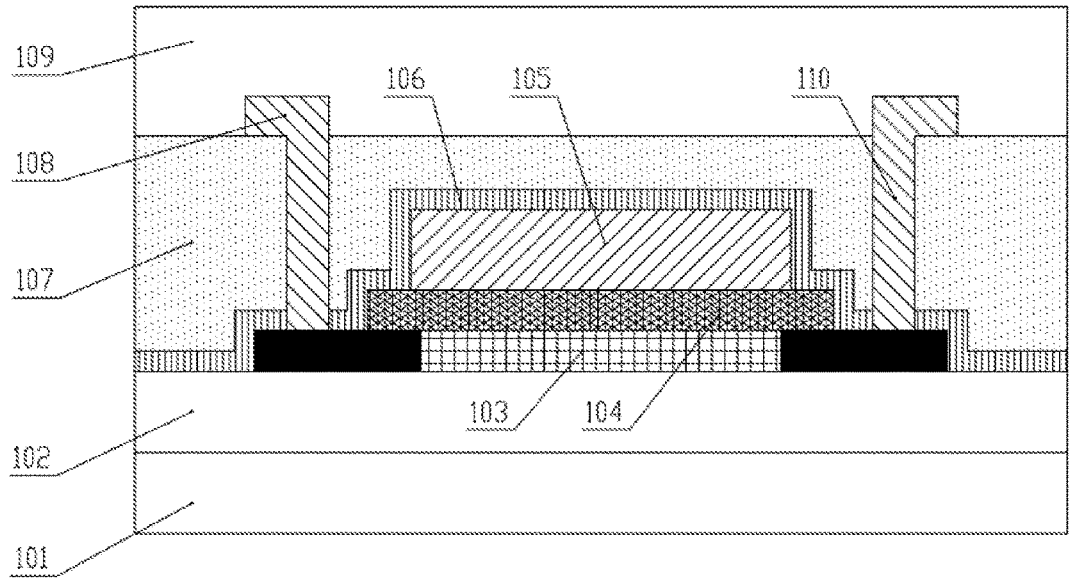
FIG. 1 is a film structural diagram of a thin film transistor array substrate in a prior art.
Figure 2:
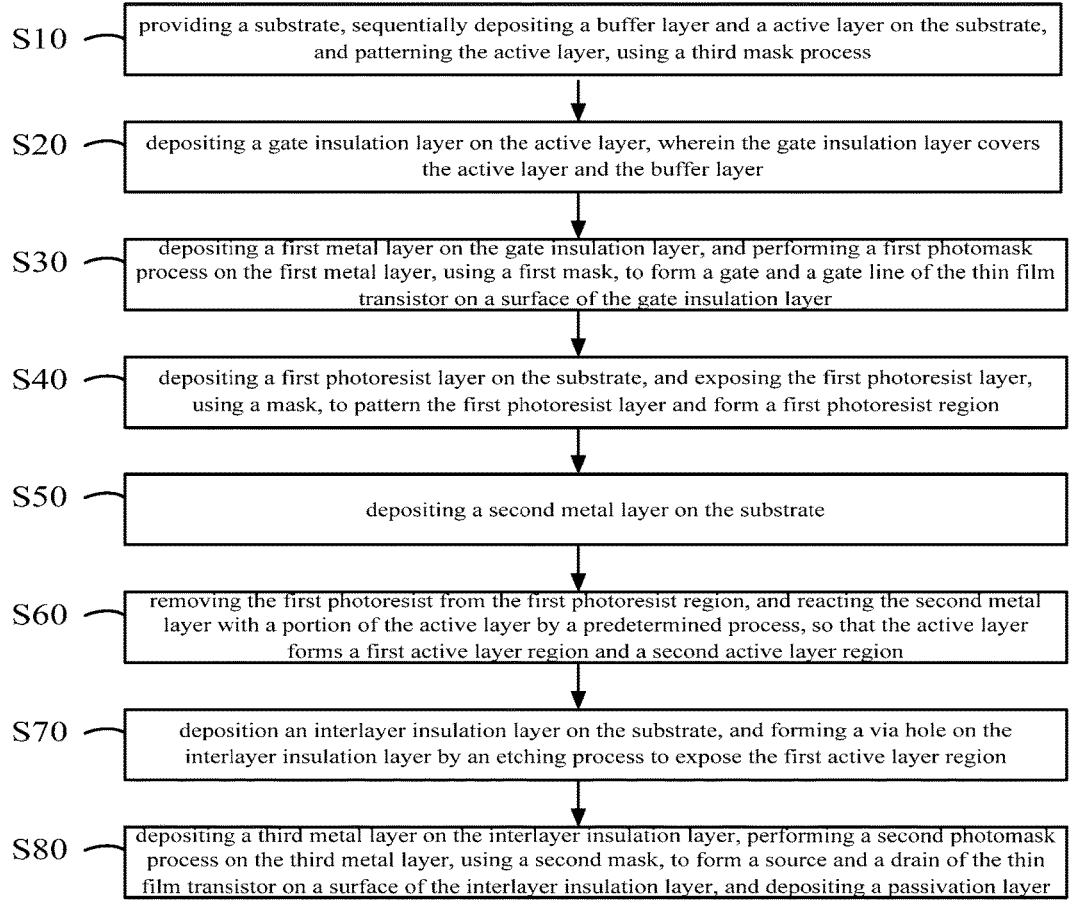
FIG. 2 is a flow chart of a manufacturing method for a thin film transistor array substrate in according with a preferred embodiment of the present disclosure.

FIG. 2 is a flow chart of a manufacturing method for a thin film transistor array substrate in according with a preferred embodiment of the present disclosure. The method includes the following steps:

In step S10, the substrate 201 is provided, a buffer layer 202 and the active layer 203 are sequentially deposited on the substrate 201, and the active layer 203 is patterned, using a third mask process.

Figure 3:
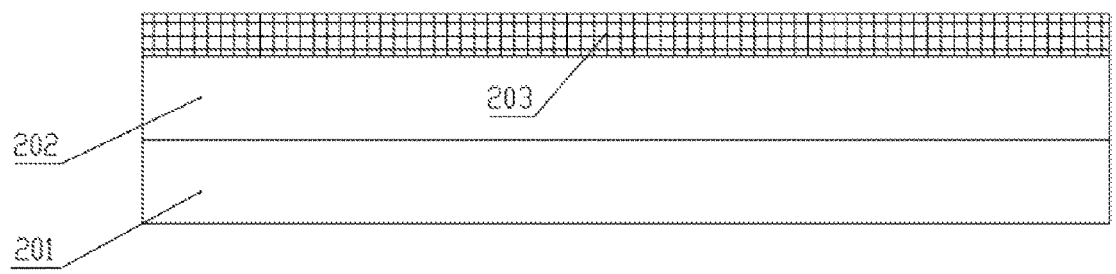
FIG. 3 to FIG. 13 are flow charts of a manufacturing method for a thin film transistor array substrate in accordance with the preferred embodiment of the present disclosure.

Firstly, a substrate 201 is provided, on which a buffer layer 202 and an active layer 203 are sequentially deposited, as shown in FIG. 3. Preferably, in the present embodiment, the active layer 203 is a metal oxide film, such as indium gallium zinc oxide, and the oxide is a semiconductor.

Figure 4:
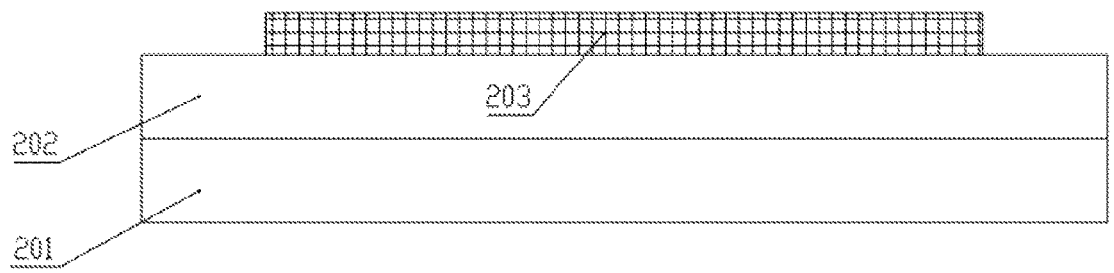

Afterwards, a photoresist is coated on the active layer 203, and a predetermined pattern is formed on the buffer layer 202, using a mask, through exposing, developing, etching and removing steps of a patterning process, as shown in FIG. 4.

In step S20: a gate insulation layer 204 is deposited on the active layer 203, wherein the gate insulation layer 204 covers the active layer 203 and the buffer layer 202.

The gate insulation layer 204 is deposited on the substrate 201 after the photomask process. Preferably, material of the gate insulation layer 204 is silicon nitride, and silicon oxide, silicon oxynitride, and the like may also be used as the material.

Figure 5:
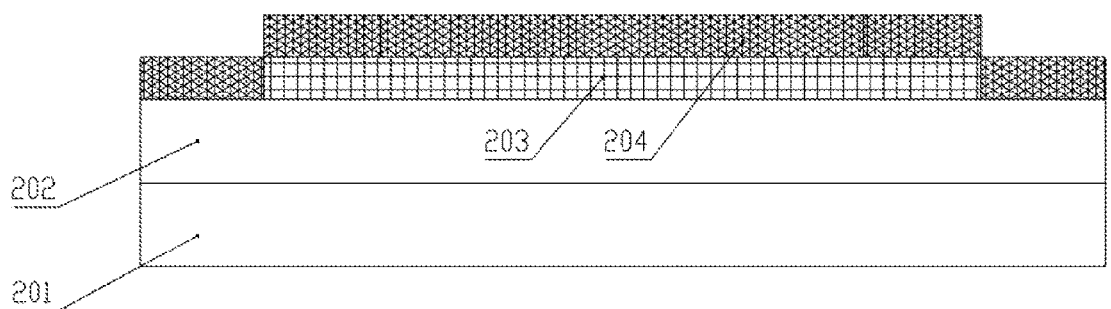

The gate insulation layer 204 completely covers the active layer 203 and the buffer layer 202, as shown in FIG. 5.

In step S30, a first metal layer 205 is deposited on the gate insulation layer 204, and a first photomask process is performed on the first metal layer 205, using a first mask, to form a gate and a gate line of the thin film transistor on a surface of the gate insulation layer 204.

Firstly, the first metal layer 205 may be deposited on the gate insulation layer 204 by a magnetron sputtering process. The metal material may be molybdenum, aluminum, aluminum-nickel alloy, molybdenum-tungsten alloy, chromium, copper, other similar metals, and the combination structures of the above several material films.

Afterwards, a photoresist is coated on the first metal layer 205, and the gate and the gate line of the thin film transistor is formed on the substrate 201, using a mask, through exposing, developing, etching and removing steps of a patterning process. Preferably, the etching process applied to the first metal layer 205 is wet etching.

Next, an etching process is performed on the gate insulation layer 204 to expose both ends of the active layer 203, so that a second metal layer contacts both ends of the active layer 203. The area of the second metal layer contacting the active layer 203 is as large as possible, so that the subsequent reaction is sufficient. The etching process applied to the gate insulation layer 204 is dry etching.

Figure 6:
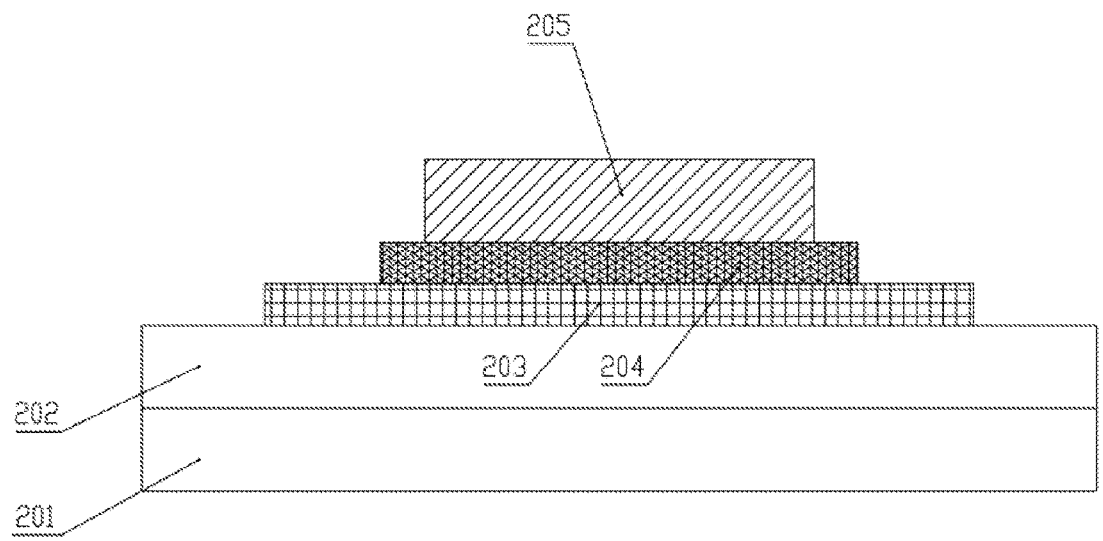

The area of the active layer 203 is greater than the area of the gate insulation layer 204, and the area of the gate insulation layer 204 is greater than the area of the first metal layer 205, as shown in FIG. 6.

In step S40, a first photoresist layer 206 is deposited on the substrate 201, and the first photoresist layer 206 is exposed, using a mask, to pattern the first photoresist layer 206 and form a first photoresist region.

Figure 7:
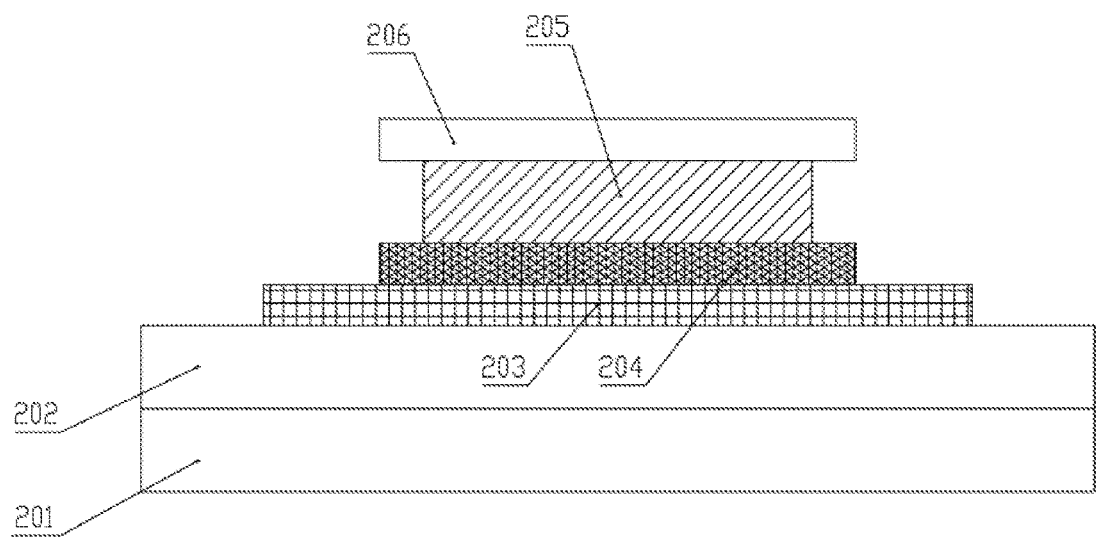

Firstly, a first photoresist layer 206 is deposited on the substrate 201, and the first photoresist layer 206 is exposed and developed, using a mask, so that the first photoresist layer 206 deposited on the substrate 201 forms the first photoresist region, as shown in FIG. 7.

The first photoresist region is located on the surface of the first metal layer 205, and completely covers the first metal layer 205. The first photoresist layer 206 may be a positive photoresist or a negative photoresist.

In step S50: a second metal layer 207 is deposited on the substrate 201.

Figure 8:
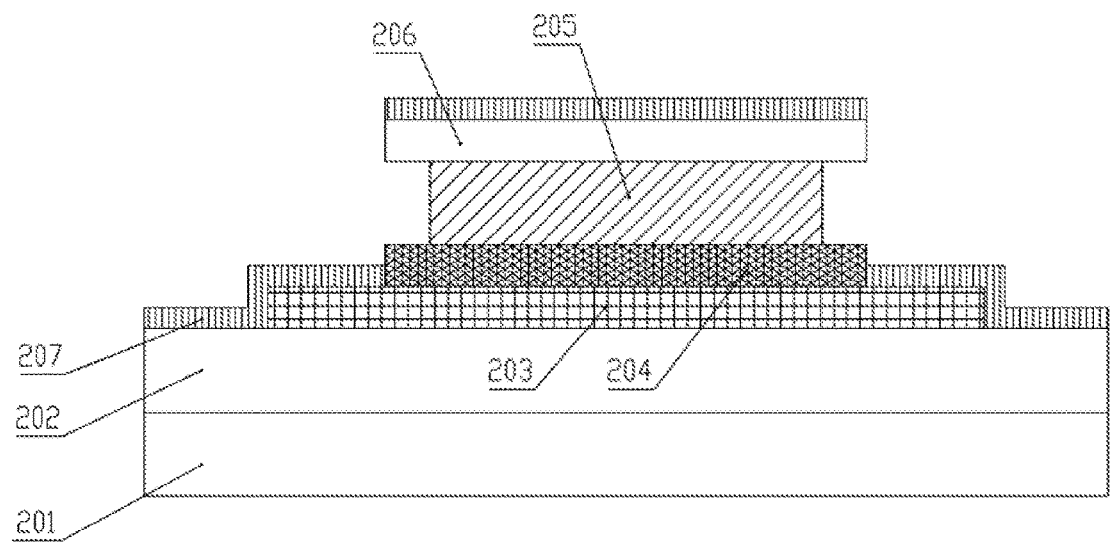

The second metal layer 207 is deposited on the substrate 201, as shown in FIG. 8, the second metal layer 207 is an active metal film, and the active metal is magnesium, aluminum, calcium, or a mixture thereof.

The thickness of the second metal layer 207 ranges from 5 nm to 50 nm.

In step S60, the photoresist is removed from the first photoresist region, and the second metal layer 207 reacts with a portion of the active layer 203 by a predetermined process, so that the active layer 203 forms a first active layer region 208 and a second active layer region 209.

Figure 9:
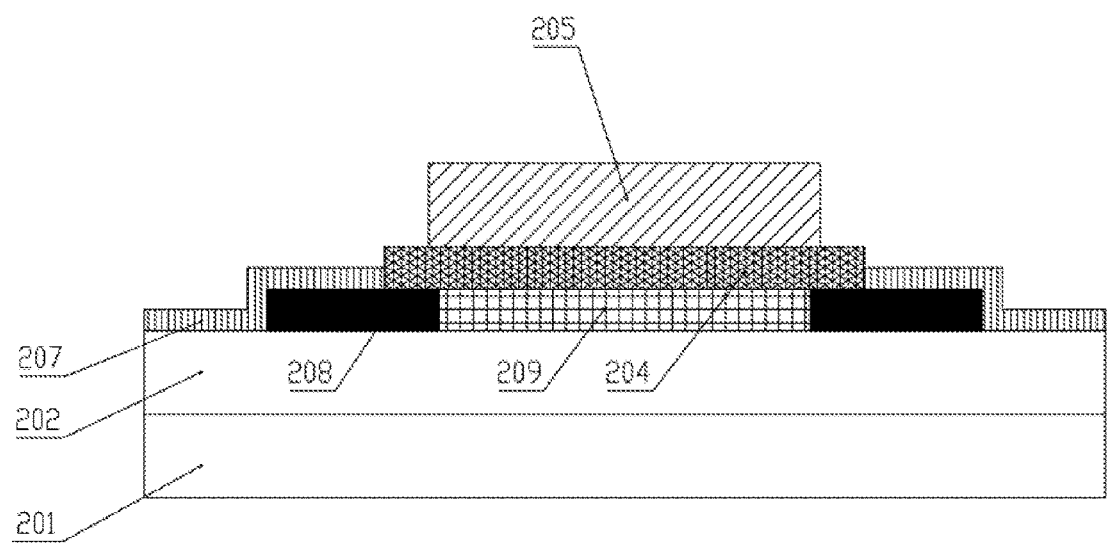

Firstly, a removing process is used to remove the photoresist from the first photoresist region, and the second metal layer 207 deposited on the first photoresist region is also removed during the removing process, so that the surface of the first metal layer 205 is not covered by the second metal layer 207, as shown in FIG. 9.

Subsequently, the second metal layer 207, which is not removed, reacts with the portion of the active layer 204, which is not shielded by the gate insulation layer 204, by the predetermined process, so that the active layer 203 forms the first active layer region 208 and the second active layer region 209, as shown in FIG. 9.

Preferably, the predetermined process is a high temperature annealing process performed in an aerobic or anaerobic environment, wherein a temperature corresponding to the high temperature annealing process ranges from 200° C. to 400° C.

In addition, when the high temperature annealing process is used to react the active metal, which is not removed, with the active layer 204, which is not shielded by the gate insulation layer 204, the active metal reacts with oxygen elements in the active layer 203 to form a corresponding metal oxide. The active layer 203 generates oxygen vacancies due to the oxygen elements being lost, thereby reducing resistance of the active layer 203, so that the active layer 203 is transformed from a semiconductor into a conductor to form the first active layer region 208, wherein the second active layer region 209 is an unreacted region.

In step S70, an interlayer insulation layer 210 is deposited on the substrate 201, and a via hole 211 is formed on the interlayer insulation layer 210 by an etching process to expose the first active layer region 208.

Figure 10:
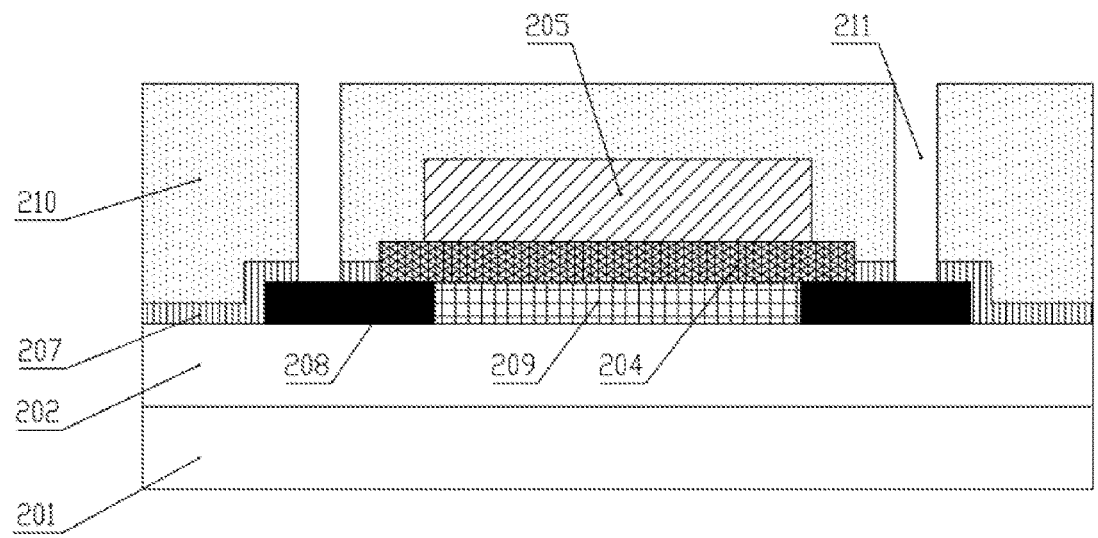

As shown in FIG. 10, the interlayer insulation layer 210 is deposited on the substrate 201, and the interlayer insulation layer 210 is a protective layer to separate the gate from a source/drain 213. Afterwards, the etching process is performed to form the via hole 211 on the interlayer insulation layer 210 to expose the first active layer region 208, so that subsequently, the source/drain 213 are electrically connected to the first active layer region 208 via the via hole 211.

In step S80, a third metal layer 212 is deposited on the interlayer insulation layer 210, a second photomask process is performed on the third metal layer 212, using a second mask, to form the source/drain 213 of the thin film transistor on a surface of the interlayer insulation layer, and a passivation layer 214 is deposited.

Figure 11:
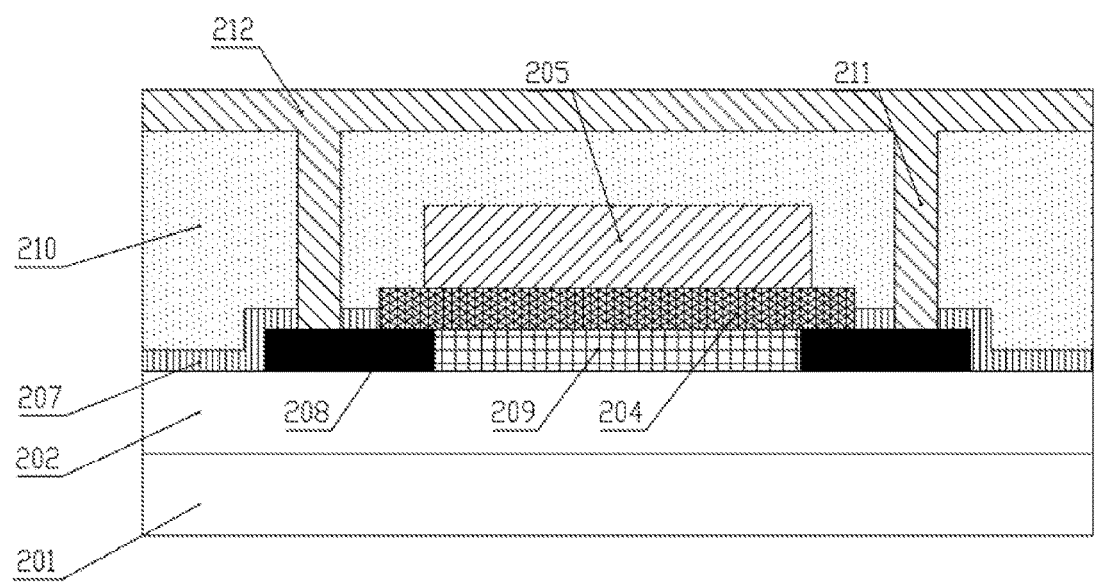

Firstly, the third metal layer 212 is deposited on the interlayer insulation layer 210. Metal material of the third metal layer 212 may be molybdenum, aluminum, aluminum-nickel alloy, molybdenum-tungsten alloy, chromium, copper, or other similar metals, and the combination structures of the above several material films, wherein the third metal material is also filled in the via hole 211, as shown in FIG. 11.

Figure 12:
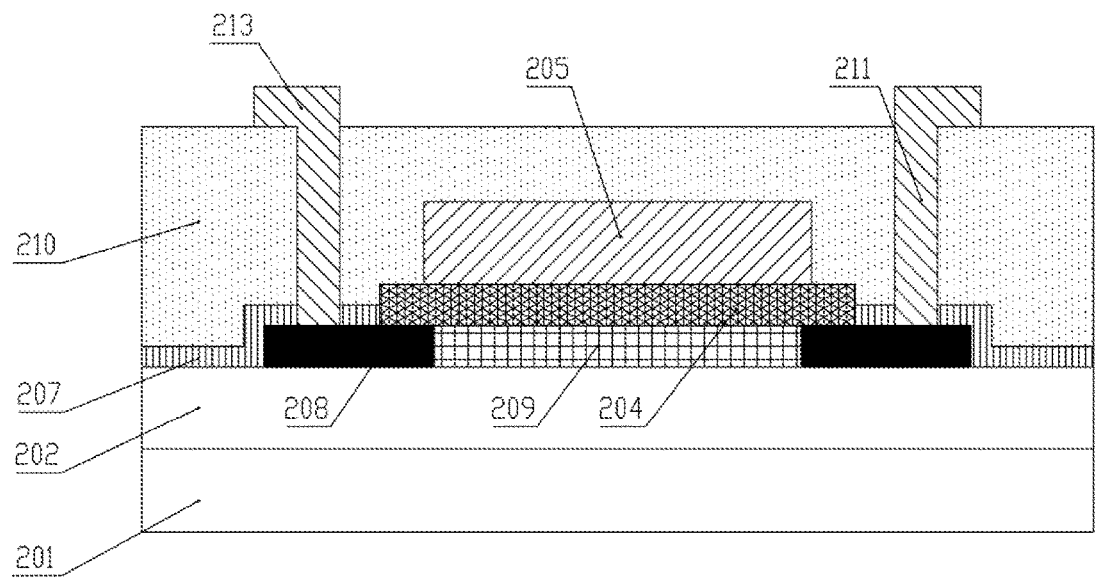
Figure 13:
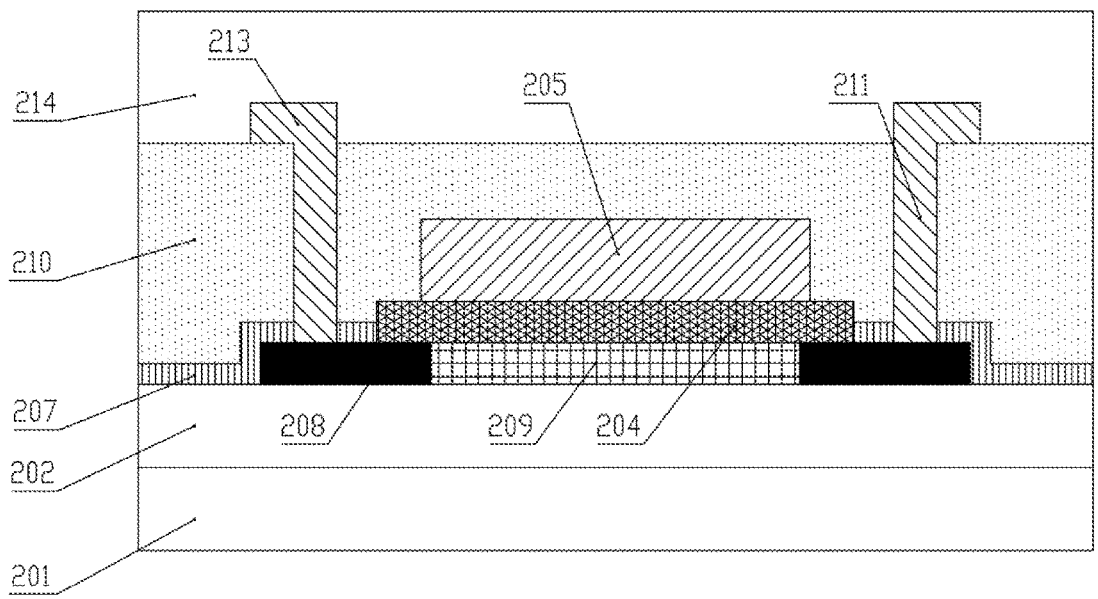

Subsequently, a third photoresist layer is deposited on a surface of the third metal layer 212. After the third photoresist layer is exposed and developed, an etching process is performed on the third metal layer 212 to form the source/drain 213 of the thin film transistor on the surface of the interlayer insulation layer 210, as shown in FIG. 12. The passivation layer is deposited on the third metal layer 212, as shown in FIG. 13. Preferably, material of the passivation layer 214 is typically a silicon oxynitride compound.

A manufacturing method for a thin film transistor array substrate is provided in the present disclosure. The method includes steps of depositing the first photoresist layer on the substrate before depositing the active metal layer; removing the first photoresist layer on the surface of the first metal layer from the active metal by a removing process after exposing and developing the first photoresist layer, thereby avoiding the problem of electrical leakage of the TFT array substrate due to incomplete oxidation of the active metal. Moreover, the gate insulation layer and the first metal layer are etched in the same photomask process, thereby reducing costs and improving manufacturing efficiency.

In summary, although the preferable embodiments of the present disclosure have been disclosed above, the embodiments are not intended to limit the present invention. A person of ordinary skill in the art, without departing from the spirit and scope of the present invention, can make various modifications and variations. Therefore, the scope of the invention is defined in the claims.

What is claimed is:

1. A manufacturing method for a thin film transistor array substrate, comprising steps of:
    step S30: depositing a first metal layer on a gate insulation layer, and performing a first photomask process on the first metal layer, using a first mask, to form a gate and a gate line of the thin film transistor on a surface of the gate insulation layer;
    step S40: depositing a first photoresist layer on a substrate, and exposing the first photoresist layer, using a mask, to pattern the first photoresist layer and form a first photoresist region;
    step S50: depositing a second metal layer on the substrate, wherein the second metal layer is an active metal, the active metal is one or more mixtures of magnesium, aluminum, and calcium, and a film thickness of the second metal layer ranges from 5 nm to 50 nm;
    step S60: removing the first photoresist from the first photoresist region, and reacting the second metal layer with a portion of an active layer by a predetermined process, so that the active layer forms a first active layer region and a second active layer region;
    step S70: depositing an interlayer insulation layer on the substrate, and forming a via hole on the interlayer insulation layer by an etching process to expose the first active layer region; and
    step S80: depositing a third metal layer on the interlayer insulation layer, performing a second photomask process on the third metal layer, using a second mask, to form a source and a drain of the thin film transistor on a surface of the interlayer insulation layer, and depositing a passivation layer.

2. The manufacturing method as claimed in claim 1, before the step S30, further comprising steps of:
    step S10: providing the substrate, sequentially depositing a buffer layer and the active layer on the substrate, and patterning the active layer, using a third mask process; and
    step S20: depositing a gate insulation layer on the active layer, wherein the gate insulation layer covers the active layer and the buffer layer.

3. The manufacturing method according to claim 1, wherein the step S30 comprises steps of:
    step S31: depositing the first metal layer on the gate insulation layer;
    step S32: coating a second photoresist layer on the first metal layer;
    step S33: after the second photoresist layer is exposed and developed, performing a first etching process on the first metal layer, to form the gate and the gate line of the thin film transistor on the surface of the gate insulation layer; and step S34: performing a second etching process on the gate insulation layer to expose both ends of the active layer, so that the second metal layer is in contact with the both ends of the active layer;

step S35: removing the second photoresist layer.

4. The manufacturing method as claimed in claim 3, wherein an area of the active layer is greater than an area of the gate insulation layer, and an area of the gate insulation layer is greater than an area of the first metal layer.

5. The manufacturing method as claimed in claim 1, wherein the step S60 comprises steps of:

step S61: removing the first photoresist and a portion of the second metal layer deposited on the first photoresist region from the first photoresist region; and step S62: reacting an unremoved portion of the second metal layer with the portion of the active layer by the predetermined process, so that the active layer forms a first active layer region and a second active layer region.

6. The manufacturing method as claimed in claim 5, wherein the predetermined process is a high temperature annealing process performed in an aerobic or anaerobic environment, wherein a temperature corresponding to the high temperature annealing process ranges from 200° C. to 400° C.

7. The manufacturing method as claimed in claim 5, wherein the unremoved portion of the active metal reacts with the portion of the active layer by the high temperature annealing process, wherein the active metal reacts with an oxygen element in the active layer to form a corresponding metal oxide, the active layer is transformed into a conductor by losing the oxygen element to form the first active layer region, and the second active layer region is an unreacted region.

8. The manufacturing method as claimed in claim 1, wherein the step S80 comprises steps of:

step S81: depositing the third metal layer on the interlayer insulation layer;

step S82: coating a third photoresist layer on the third metal layer;

step S83: after the third photoresist layer is exposed and developed, an etching process is performed on the third metal layer to form a source and a drain of the thin film transistor on the surface of the interlayer insulation layer;

step 84: removing the third photoresist layer; and step 85: depositing the passivation layer.

9. The manufacturing method as claimed in claim 8, wherein the source and the drain are electrically connected to the first active layer region through the via hole on the interlayer insulation layer.

10. A manufacturing method for a thin film transistor array substrate, comprising steps of:

step S30: depositing a first metal layer on a gate insulation layer, and performing a first photomask process on the first metal layer, using a first mask, to form a gate and a gate line of the thin film transistor on a surface of the gate insulation layer;

step S40: depositing a first photoresist layer on a substrate, and exposing the first photoresist layer, using a mask, to pattern the first photoresist layer and form a first photoresist region;

step S50: depositing a second metal layer on the substrate;

step S60: removing the first photoresist from the first photoresist region, and reacting the second metal layer with a portion of an active layer by a predetermined process, so that the active layer forms a first active layer region and a second active layer region;

step S70: deposition an interlayer insulation layer on the substrate, and forming a via hole on the interlayer insulation layer by an etching process to expose the first active layer region; and step S80: depositing a third metal layer on the interlayer insulation layer, performing a second photomask process on the third metal layer, using a second mask, to form a source and a drain of the thin film transistor on a surface of the interlayer insulation layer, and depositing a passivation layer.

11. The manufacturing method as claimed in claim 10, before the step S30, further comprising steps of:

step S10: providing the substrate, sequentially depositing a buffer layer and the active layer on the substrate, and patterning the active layer, using a third mask process; and step S20: depositing a gate insulation layer on the active layer, wherein the gate insulation layer covers the active layer and the buffer layer.

12. The manufacturing method according to claim 10, wherein the step S30 comprises steps of:

step S31: depositing the first metal layer on the gate insulation layer;

step S32: coating a second photoresist layer on the first metal layer;

step S33: after the second photoresist layer is exposed and developed, performing a first etching process on the first metal layer, to form the gate and the gate line of the thin film transistor on the surface of the gate insulation layer; and step S34: performing a second etching process on the gate insulation layer to expose both ends of the active layer, so that the second metal layer is in contact with the both ends of the active layer;

step S35: removing the second photoresist layer.

13. The manufacturing method as claimed in claim 12, wherein an area of the active layer is greater than an area of the gate insulation layer, and an area of the gate insulation layer is greater than an area of the first metal layer.

14. The manufacturing method as claimed in claim 10, wherein the step S60 comprises steps of:

step S61: removing the first photoresist and a portion of the second metal layer deposited on the first photoresist region from the first photoresist region; and step S62: reacting an unremoved portion of the second metal layer, not being removed, with the portion of the active layer by the predetermined process, so that the active layer forms a first active layer region and a second active layer region.

15. The manufacturing method as claimed in claim 14, wherein the predetermined process is a high temperature annealing process performed in an aerobic or anaerobic environment, wherein a temperature corresponding to the high temperature annealing process ranges from 200° C. to 400° C.

16. The manufacturing method as claimed in claim 14, wherein the unremoved portion of the active metal, not being removed, with the portion of the active layer by the high temperature annealing process, wherein the active metal reacts with an oxygen element in the active layer to form a corresponding metal oxide, the active layer is transformed into a conductor by losing the oxygen element to form the first active layer region, and the second active layer region is an unreacted region.

17. The manufacturing method as claimed in claim 10, wherein the step S80 comprises steps of:
   step S81: depositing the third metal layer on the interlayer insulation layer;
   step S82: coating a third photoresist layer on the third metal layer;
   step S83: after the third photoresist layer is exposed and developed, an etching process is performed on the third metal layer to form a source and a drain of the thin film transistor on the surface of the interlayer insulation layer;
   step 84: removing the third photoresist layer; and
   step 85: depositing the passivation layer.

18. The manufacturing method as claimed in claim 17, wherein the source and the drain are electrically connected to the first active layer region through the via hole on the interlayer insulation layer.

* * * * *